United States Patent [19]

Akao

[11] Patent Number: 5,107,294
[45] Date of Patent: Apr. 21, 1992

[54] IMAGE RECORDING APPARATUS HAVING DETECTION UNIT FOR DETECTING MALFUNCTION OF TAKE-UP ROLLER

[75] Inventor: Michitoshi Akao, Nagoya, Japan

[73] Assignee: Brother Kogyo Kabushiki Kaisha, Nagoya, Japan

[21] Appl. No.: 701,000

[22] Filed: May 13, 1991

Related U.S. Application Data

[63] Continuation of Ser. No. 281,346, Dec. 8, 1988, abandoned.

[30] Foreign Application Priority Data

Dec. 11, 1987 [JP] Japan ............................ 62-189347[U]

[51] Int. Cl.⁵ .................................................. G03B 27/32
[52] U.S. Cl. ......................................... 355/27; 242/57; 242/75.51
[58] Field of Search .................... 355/27, 200, 210; 352/14, 172; 242/57, 75.51

[56] References Cited

U.S. PATENT DOCUMENTS

| | | | |
|---|---|---|---|
| 3,687,542 | 8/1972 | Suzuki et al. | 352/172 X |
| 3,734,052 | 5/1973 | Feldman | 352/172 X |
| 4,135,809 | 1/1979 | Ponce | 355/27 |
| 4,278,338 | 7/1981 | Baker et al. | 355/27 X |
| 4,291,843 | 9/1981 | Yanagawa et al. | 242/57 |
| 4,532,500 | 7/1985 | Henk | 242/57 X |
| 4,624,560 | 11/1986 | Beery | 355/27 |
| 4,742,374 | 5/1988 | Yamamoto et al. | 355/27 |
| 4,806,982 | 2/1989 | Yamamoto et al. | 355/27 |
| 4,816,873 | 3/1989 | Hatta | 355/27 |

Primary Examiner—Fred L. Braun
Attorney, Agent, or Firm—Oliff & Berridge

[57] ABSTRACT

An image recording apparatus for forming a latent image on a photosensitive recording medium and for developing the latent image on a developer sheet. The apparatus includes a winding unit for winding up the photosensitive recording medium subjected to development, a detecting unit for detecting occurrence of malfunction of the winding unit, and an alarming unit for alarming the occurrence of malfunction. The detecting unit detects the occurrence of malfunction of the winding unit, and the detection signal from the detecting unit is supplied to the alarming unit, to thereby alarm the occurrence of malfunction and stop the copying operation.

7 Claims, 3 Drawing Sheets

IMAGE RECORDING APPARATUS HAVING DETECTION UNIT FOR DETECTING MALFUNCTION OF TAKE-UP ROLLER

This is a continuation of application Ser. No. 07/281,346 filed Dec. 8, 1988 now abandoned.

BACKGROUND OF THE INVENTION

The present invention relates to an image recording apparatus, and more particularly to an image recording apparatus using a photosensitive recording medium as a recording medium.

Conventional image recording devices of this type comprises exposing means for exposing a photosensitive pressure-sensitive recording medium to light and forming a latent image, pressure developing means for developing the exposed photosensitive pressure-sensitive recording medium under pressure, conveying means for conveying the photosensitive pressure-sensitive recording medium to the pressure developing means from the exposing means, and winding means for winding up the photosensitive pressure-sensitive recording medium subjected to development.

However, the conventional devices are not equipped with means for detecting occurrence of malfunction of the winding means, so that these devices continue the image recording operation even when the winding means is not properly functioning. This would result in jamming of the photosensitive pressure-sensitive recording medium within the devices.

SUMMARY OF THE INVENTION

The present invention has been made in view of the foregoing disadvantages, and accordingly, it is an object of this invention to provide an image recording apparatus which detects occurrence of malfunction of the winding means and generate an alarm to thereby prevent a photosensitive recording medium from being jammed within the apparatus.

In order to achieve the foregoing objects, the image recording apparatus according to the present invention comprises exposing means for exposing a photosensitive recording medium to light, developing means for developing the photosensitive recording medium having a latent image formed thereon through light exposure, conveying means for conveying the photosensitive recording medium to the developing means from the exposing means, winding means for winding up the photosensitive recording medium subjected to development, detecting means for detecting occurrence of malfunction of the winding means and providing detection signal, and alarming means responsive to the detection signal for alarming the occurrence of malfunction. According to the present invention, the detecting means detects the occurrence of malfunction of the winding means, and an alarm will be generated to stop the copying operation.

DETAILED DESCRIPTION OF THE PREFERRED EMBODIMENT

An embodiment of this invention will be described below with reference to the accompanying drawings.

Figure 1:
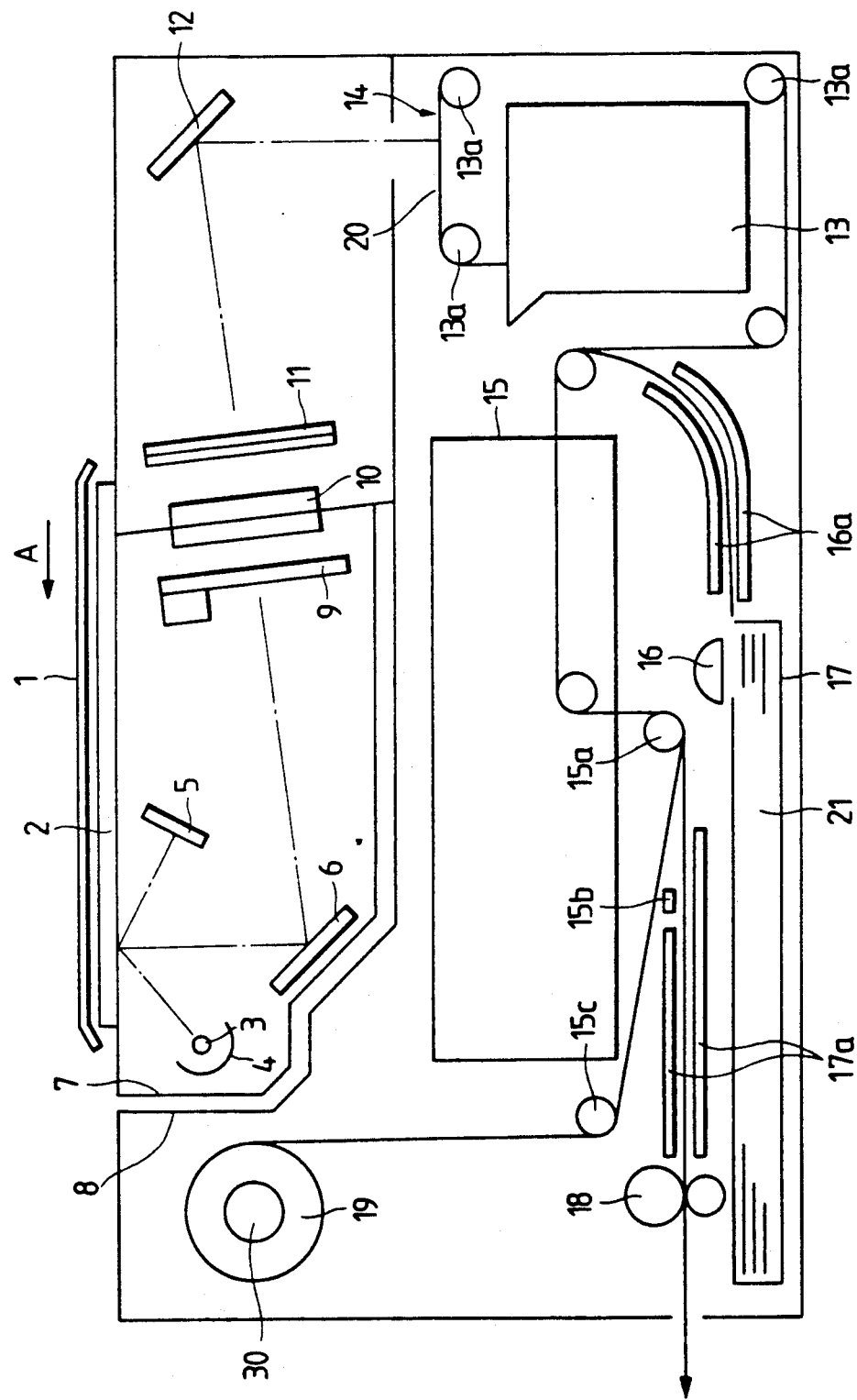
FIG. 1 is a schematic elevational view showing an image recording apparatus according to the present invention.

FIG. 1 shows a copying machine capable of performing a full-color copying. This copying machine employs the transfer type image recording mediums as a photosensitive sheet as described in U.S. Pat. No. 4,399,209 and Japanese Patent Application Kokai No. 58-88739 (which comprises a microcapsule sheet and a developer sheet). Other types of photosensitive sheets may be used as well.

As shown in FIG. 1, the copying machine has an original support stand cover 1 mounted on the upper portion of a main body or housing. An original support stand 2 made of transparent glass is disposed beneath the cover 1. An original to be copied or recorded is placed, with its top surface facing down, on the stand 2, and then covered with the cover 1. Under the stand 2 is disposed a light source 3 for emitting light to scan the top surface of the original. A cold mirror 4 is provided on the left rear side of the light source 3.

The light source 3 emits a linear-line light ray and irradiates light on a predetermined line on the surface of the original, and the cold mirror 4 passes the heat rays from the light source 3 and reflects the visible rays therefrom. At the time light exposure is performed, the cover 1 is moved together with the original in the direction of the arrow A by a conveying device (not shown in the drawings). In other words, the original moves in a direction normal to the predetermined line on which the light is irradiated.

On the right side of the light source 3 is disposed a reflector 5 which reflects a part of the light from the light source 3 which light is not directed toward the original, and the reflected light is irradiated on the predetermined line on the original surface. Below the predetermined line is disposed a reflector 6 which reflects the light reflected from the predetermined line on the original surface and directs the light to the right direction within the copying machine. On the right side of the reflector 6 is provided a shutter 9 which shields or passes the light reflected by the reflector 6.

A lens 10 is disposed on the right side of the shutter 9. A filter 11 is provided on the right side of the lens 10 to allow light having predetermined wavelengths to selectively pass therethrough, that is, the filter 11 selectively passes cyan, magenta and yellow lights. At the upper right portion of the copying machine there is provided a reflector 12 which reflects and directs the light passing through the filter 11 downwardly. Below the reflector 12 is disposed an exposure unit 14 which exposes microcapsule sheet 20 to light. A patrone or cartridge 13 is provided under the exposure unit 14 for retaining the unused elongated web-like microcapsule sheet 20 in a roll. Around the cartridge 13 are provided a plurality of feeding rollers 13a for feeding the microcapsule sheet 20. A motor 13b is also provided so as to feed the microcapsule sheet 20 in synchronism with the original support stand 2. With the rotation of the motor 13b, the microcapsule sheet 20 is fed around the cartridge 13 by the feed rollers 13a and then to a pressure developing unit 15 provided on the left side of the cartridge 13. In this case, the original which moves together with the original support stand 2 is moved in sychronism with the microcapsule sheet 20, so that a latent image corresponding to the image on the original is formed on the microcapsule sheet 20.

Under the pressure developing unit 15 lies a cartridge 17 for retaining cut-sheet type developer sheets 21. Above the cartridge 17 is dispose a sector roller 16 which takes out and feeds the developer sheets 21 one by one in the right direction and each developer sheet 21 is fed to the left side of the cartridge 13 by a pair of guides 16a. The developer sheet 21 is then brought into close contact with the microcapsule sheet 20 having a latent image formed thereon through exposure, and both sheets are fed to the pressure developing unit 15 in close contact state. As the pressure developing unit 15 used in this embodiment is disclosed in detail in Japanese Patent Application No. 62-36413 (corresponding to U.S. patent application Ser. No. 07/157,478, filed Feb. 17, 1988, now U.S. Pat. No. 4,872,032), its detailed description will be omitted here.

These sheets 20 and 21 are conveyed through the pressure developing unit 15 and are then carried leftwardly by a guide roller 15a provided below the pressure developing unit 15. Thereafter, the sheets 20 and 21 are separated from each other by a separator 15b disposed on the left side of the guide roller 15a. After separation, the microcapsule sheet 20 is carried upwardly by a guide roller 15c disposed on the left side of the separator 15b, and the used microcapsule sheet 20 is wound around a take-up roller 19 provided on the upper left portion of the copying machine. While, the separated developer sheet 21 is carried leftwardly by a pair of sheet guides 17a disposed above the cartridge 17. On the left side of the sheet guides 17a is provided a thermal fixing unit 18 so as to add luster to the developer sheet having an image recorded thereon through the previous process. The image fixed developer sheet 21 passing through the thermal fixing unit 18 will be discharged out of the copying machine.

An encoder 30 is mounted on the shaft of the take-up roller 19 to detect the rotational amount of the roller 19.

As the encoder in this embodiment, employed is conventional rotary encoder such as encorder having opto electronic device, encorder having magnetic device or the like.

Figure 2:
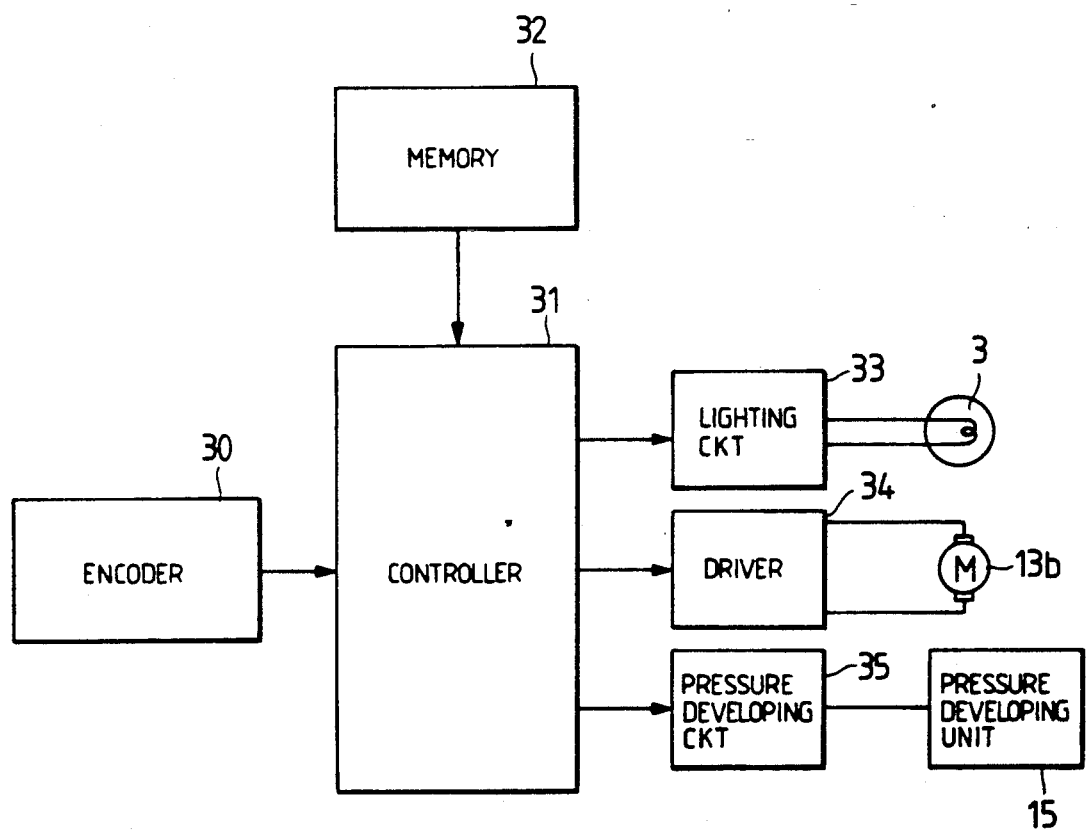
FIG. 2 is a block diagram illustrating an electric circuit of the image recording apparatus.

FIG. 2 is a block diagram illustrating an electric circuit of the copying machine. A controller 31 operates in accordance with programs stored in a memory 32, and supplys signals to a circuit 33 for turning on the light source 3, a motor driver 34 for driving the motor 13b and a pressure developing circuit 35 for driving the pressure developing unit 15. The output signal of the encoder 30 mounted on the shaft of the take-up roller 19 is supplied to the controller 31.

Operation of the image recording apparatus thus constructed will be described below with reference to FIGS. 1 and 2.

With the original staying at the initial position, the light source 3 and reflector 5 irradiate light on the predetermined line on the original. The reflected light from the original is led rightwardly by the reflector 6, and passes through the shutter 9, lens 10 and filter 11, thereafter the light is reflected downwardly by the reflector 12. This last reflected light is finally directed toward the microcapsule sheet 20 located in the exposure unit 14 to form the latent image on the sheet 20.

When the original support stand cover 1 starts moving together with the original in the direction A, the microcapsule sheet 20 also starts moving by means of the motor 13b and the rollers 13a provided around the cartridge 13. Upon completion of the movement of the original, a latent image corresponding to the image on the original is formed on the microcapsule sheet 20. In this case, the length of the microcapsule sheet 20 extending around the cartridge 13 is longer than that of the original placed on the original support stand 2. The microcapsule sheet 20 having the latent image formed thereon is set in close contact with the developer sheet 21 which has fed out from the cartridge 17 by means of the sector roller 16 and the sheet guide 16a, and both sheets are then inserted into the pressure developing unit 15. The microcapsule-carrying surface of the microcapsule sheet 20 on which a latent image is formed contacts the developer-coated surface of the developer sheet 21 at a position inside the pressure developing unit 15, and these superposed sheets are pressed together by a pair of rollers in the unit 15. Unexposed microcapsules are ruptured by the applied pressure, to thereby form an output image on the developer sheet 21 because of the reaction of chromogenic material with the developer material.

After being discharged from the pressure developing unit 15, these sheets 20 and 21 are turned leftwardly by the roller 15a and are separated from each other by the separator 15b. The separated microcapsule sheet 20 is carried upwardly by the roller 15c and is wound around the take-up roller 19. The separated developer sheet 21 is carried leftwardly and passes through the thermal fixing unit 18 where the image on the developer sheet 21 is subjected to thermal fixing. Thereafter, the developer sheet 21 is discharged out of the copying machine.

Meanwhile, the output signal of the encoder 30 mounted on the shaft of the take-up roller 19 is input to, and monitored by, the controller 31. When the take-up roller 19 is stopped due to the occurrence of malfunction of the roller 19, such as the roller 19 getting thicker by winding operation and hitting against the inner wall of the apparatus, or the roller 19 coming off the driver source, no signal is generated from the encoder 30. When no signal is inputted to the controller 31 from the encoder 30 for a predetermined time, the controller 31 detects that some malfunction has occurred on the take-up roller 19, and stops the copying operation and generates an alarm by means of alarming means such as display device made of an LED display or a sound producing device made of a buzzer. Accordingly, encoder 30 functions as means for detecting occurrence of malfunction by detecting that take-up roller 19 is stopped.

Figure 3:
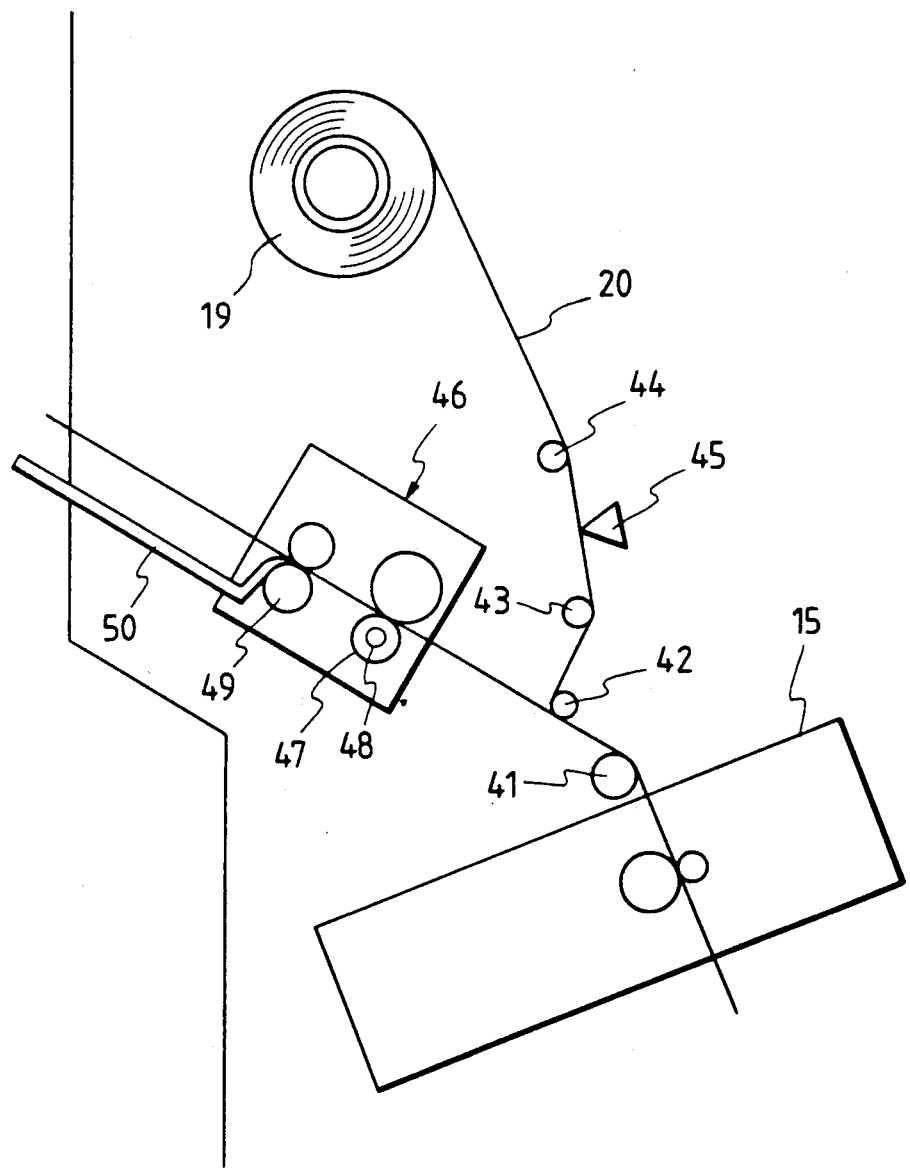
FIG. 3 is a schematic elevational view showing a modification of the present invention.

A modification of the present invention will be described below with reference to FIG. 3.

In the modification, above the pressure developing unit 15, a feed roller 41 is provided so as to provide constant running speed of the microcapsule sheet 20. At the upper left portion of the feed roller 41 there is provided a separation roller 42 at which the microcapsule sheet 20 is separated from the developer sheet 21. Between the separation roller 42 and the take-up roller 19 are provided two guide rollers 43, 44. Between two guide rollers 43, 44 is disposed sensor 45 for detecting a tensile state of the microcapsule sheet 20. The sensor 45 comprises a limit switch having a contact which makes contact with the surface of the microcapsule sheet 20 and is adapted to detect the tensile state of the microcapsule sheet 20.

On the other hand, thermal fixing unit 46 is provided on the left side of the seperation roller 42. The thermal fixing unit 46 includes a hollow heat roller 47 in which a heater element 48 is disposed. Further, a developer sheet feed roller 49 is provided to feed the image fixed developer sheet 21 toward a discharge tray 50.

Next, operation of the modified embodiment will be described.

After being developed and discharged from the pressure developing unit 15, two sheet 20 and 21 are fed upwardly by the roller 41 and are separated from each other by the separation roller 42. The separated microcapsule sheet 20 is carried upwardly by the rollers 43, 44 and is wound around the take-up roller 19. The separated developer sheet 21 is carried leftwardly and passes through the thermal fixing unit 46 where the image on the developer sheet 21 is subjected to thermal fixing. Thereafter, the developer sheet 21 is discharged to the discharge tray 50.

Meanwhile, the output signal of the sensor 45 being in contact with the microcapsule sheet 20 is input to, and monitored by, the controller 31. When the take-up roller 19 is stopped due to the occurrence of malfunction of the roller 19, the microcapsule sheet 20 is moved away from the contact of the sensor 45 because of release of tension of the sheet 20. Therefore, no signal is generated from the sensor 45. When no signal is inputted to the controller 31 from the sensor 45 for a predetermined time, the controller 31 detects that some malfunction has occurred on the take-up roller 19, and stops the copying operation and generates an alarm by means of alarming means. Accordingly, sensor 45 is another means for detecting malfunction by detecting that the take-up roller 19 is stopped.

It should be understood from the above that this invention employs detecting means for detecting the occurrence of malfuction of winding means so that, upon occurrence of such malfunction, the copying operation is stopped and an alarm is generated. This can prevent wasteful feeding of a photosensitive pressure-sensitive recording medium during malfunction of winding means and prevent the recording medium from being jammed within the apparatus.

What is claimed is:

1. An image recording apparatus for recording an image corresponding to an original on an image recording medium; said apparatus comprising:
   exposing means for exposing a photosensitive recording medium to light;
   developing means for developing said photosensitive recording medium having a latent image formed thereon through light exposure;
   conveying means for conveying said photosensitive recording medium to said developing means from said exposing means;
   winding means for winding up said photosensitive recording medium subjected to development, said winding means including a take-up roller;
   detecting means for detecting occurrence of malfunction of said winding means by detecting that said take-up roller is stopped and providing a detection signal;
   alarming means for alarming said occurrence of malfunction; and
   control means for stopping an image recording operation and driving said alarming means when receiving said detection signal.

2. An image recording apparatus as defined in claim 1, wherein said detecting means comprises an encoder for detecting the rotational amount of the winding means.

3. An image recording apparatus as defined in claim 2, wherein said encoder is mounted on the shaft of said take-up roller.

4. An image recording apparatus as defined in claim 1, wherein said detecting means comprises a sensor for detecting the tensile state of said photosensitive recording medium.

5. An image recording apparatus as defined in claim 1, wherein said alarming means includes a display device for indicating said occurrence of malfunction.

6. An image recording apparatus as defined in claim 1, wherein said alarming means includes a sound producing device.

7. The image recording apparatus of claim 1 wherein said occurrence of malfunction comprises jamming of said apparatus.

* * * * *